United States Patent
Lee et al.

(10) Patent No.: US 10,304,958 B2
(45) Date of Patent: May 28, 2019

(54) THIN FILM TRANSISTOR SUBSTRATE AND DISPLAY PANEL USING THE SAME

(71) Applicant: Innolux Corporation, Miao-Li County (TW)

(72) Inventors: Kuan-Feng Lee, Miao-Li County (TW); Kuo-Chang Chiang, Miao-Li County (TW); Tzu-Min Yan, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 29 days.

(21) Appl. No.: 15/168,261

(22) Filed: May 31, 2016

(65) Prior Publication Data
US 2016/0284863 A1 Sep. 29, 2016

Related U.S. Application Data

(63) Continuation of application No. 14/814,011, filed on Jul. 30, 2015, now Pat. No. 9,379,245.

(30) Foreign Application Priority Data

Aug. 4, 2014 (TW) ................................ 103126599

(51) Int. Cl.
*H01L 27/12* (2006.01)
*H01L 29/66* (2006.01)
*H01L 29/786* (2006.01)

(52) U.S. Cl.
CPC .... *H01L 29/78606* (2013.01); *H01L 27/1218* (2013.01); *H01L 27/1225* (2013.01); *H01L 27/1248* (2013.01); *H01L 29/66969* (2013.01); *H01L 29/7869* (2013.01); *H01L 29/78609* (2013.01)

(58) Field of Classification Search
CPC .......... H01L 29/78606; H01L 29/7869; H01L 29/66969; H01L 29/78609; H01L 27/1218; H01L 27/1225; H01L 27/1248
See application file for complete search history.

(56) References Cited

U.S. PATENT DOCUMENTS

| 5,089,442 A * | 2/1992 | Olmer ................. C23C 16/0272 |
| | | 204/192.12 |
| 2004/0061159 A1* | 4/2004 | Hori .................. H01L 21/28202 |
| | | 257/296 |

(Continued)

*Primary Examiner* — Dale E Page
*Assistant Examiner* — Quovaunda Jefferson
(74) *Attorney, Agent, or Firm* — JCIPRNET

(57) ABSTRACT

A thin film transistor includes a gate electrode, a semiconductor layer, a source electrode, a drain electrode, a first protective layer, and a second protective layer. The gate electrode is disposed on a substrate. The metal oxide semiconductor layer is disposed on a gate insulating layer and electrically connects the source electrode and the drain electrode. The first protective layer disposed on the metal oxide semiconductor layer has a first oxygen vacancy concentration. The second protective layer disposed on the first protective layer has a second oxygen vacancy concentration. A boundary area located between the first and second protective layers has a third oxygen vacancy concentration. The third oxygen vacancy concentration is respectively greater than the first oxygen vacancy concentration and the second oxygen vacancy concentration.

20 Claims, 5 Drawing Sheets

(56) References Cited

U.S. PATENT DOCUMENTS

2012/0146017 A1* 6/2012 Kim .................. H01L 29/7869
                                                         257/43
2014/0273364 A1* 9/2014 Xuan ............... H01L 21/02164
                                                         438/197

* cited by examiner

THIN FILM TRANSISTOR SUBSTRATE AND DISPLAY PANEL USING THE SAME

CROSS REFERENCE TO RELATED APPLICATION

This is a continuation application of and claims the priority benefit of U.S. patent application Ser. No. 14/814,011, filed on Jul. 30, 2015, now allowed, which claims the priority benefits of Taiwan application serial no. 103126599, filed on Aug. 4, 2014. The entirety of each of the above-mentioned patent applications is hereby incorporated by reference herein and made a part of specification.

BACKGROUND

Field of the Invention

The instant disclosure relates to a structure of a thin film transistor substrate, in particular, relates to a thin film transistor substrate which can be used in a display panel.

Description of Related Art

Most thin film transistor displays include an active element array substrate. The active element array substrate is formed by disposing thin film transistors that control sub-pixels on a substrate.

A voltage is applied to thin film transistor from high to low. Hysteresis is an inconsistent phenomenon that occurs when the curve of current variation as the input voltage increases is inconsistent with another curve as the input voltage decreases. Hysteresis phenomenon makes thin film transistor difficult to control sub-pixel under the same input of voltage. Hysteresis will cause the display panel to show different brightness while accepting the same grey scale, and successively, causing flash or a ghost image on the display panel.

SUMMARY OF THE INVENTION

An embodiment of the instant disclosure provides a thin film transistor that can reduce the effect of hysteresis through the first and second protective layers.

An embodiment of the instant disclosure provides a thin film transistor substrate that includes a gate electrode, a gate insulating layer, a semiconductor layer, a source electrode, a drain electrode, a first protective layer, a second protective layer and boundary area. The gate electrode is disposed on a substrate, and the gate insulating layer is disposed on the gate electrode. The semiconductor layer is disposed on the gate insulating layer. The first protective layer, which is disposed on the semiconductor layer, has a first oxygen vacancy concentration. The second protective layer, which is disposed on the first protective layer, has a second oxygen vacancy concentration. The boundary area located between the first and second protective layers has a third oxygen vacancy concentration that is greater than the first and second oxygen vacancy concentrations respectively.

An embodiment of the instant disclosure provides a display panel that includes a first substrate, a second substrate, a display medium and an active element array layer. The first substrate is combined with the second substrate. The display medium and the active element array layer are disposed between the first and second substrates. The active element array layers includes a least one thin film transistor that includes the gate electrode, the gate insulating layer, the semiconductor layer, the source electrode, the drain electrode, the first protective layer, the second protective layer and the boundary area. The gate electrode is disposed on a substrate, and the gate insulating layer is disposed on the gate electrode. The semiconductor layer is disposed on the gate insulating layer. The first protective layer, which is disposed on the metal oxide semiconductor layer, has a first oxygen vacancy concentration. The second protective layer, which is disposed on the first protective layer, has a second oxygen vacancy concentration. The boundary area located between the first and second protective layers has a third oxygen vacancy concentration that is greater than the first and second oxygen vacancy concentrations respectively.

In summary, the instant disclosure provides at least two etch stop layers, the first and second protective layers. The first and second protective layers are produced through the same production procedure, whereas the deposition rate of the first protective layer is lower than the second protective layer. Since initially the deposition rate is relatively low, atoms bombarding with the surface of metal oxide semiconductor layer may be relative low so that current leakage is minimized when the first protective layer is being deposited. Then, as the deposition rate increases, so do the oxygen vacancies formed in the boundary area A. As the deposition rate increases, the oxygen vacancy concentration of the boundary area is larger than the oxygen vacancy concentration of the second protective layer. The hysteresis observed in the thin film transistor is improved by forming the first protective layer and the second protective layer on the metal oxide semiconductor layer, and when the deposition rate of the first protective layer is lower than the deposition rate of the second protective layer.

An embodiment of the instant disclosure provides a thin film transistor that is available to various display panels. The response speed of a display panel, the effect of hysteresis, and the flash phenomenon, or ghost image, of the display panel is improved.

In order to further understand the techniques, means and effects of the instant disclosure, the following detailed descriptions and appended drawings are hereby referred, such that, through which, the purposes, features and aspects of the instant disclosure can be thoroughly and concretely appreciated; however, the appended drawings are merely provided for reference and illustration, without any intention to be used for limiting the instant disclosure.

DETAILED DESCRIPTION OF THE PREFERRED EMBODIMENTS

The accompanying drawings show some exemplary embodiments, and a more detailed description of various embodiments with reference made to the accompanying drawings in accordance with the present disclosure is set forth below. It is worth noting that the concept of the invention may be embodied in many different forms and not to be construed as limited to the embodiment set forth herein. To be more precise, the exemplary embodiments set forth herein are provided to a person of ordinary skilled in the art to thoroughly and completely understand the content disclosed herein and fully provide the spirit of the invention. The relative size, proportions, and depiction of the layers and regions in all drawings may be exaggerated for clarity and precision. Similar numerals indicate like elements.

Figure 1:
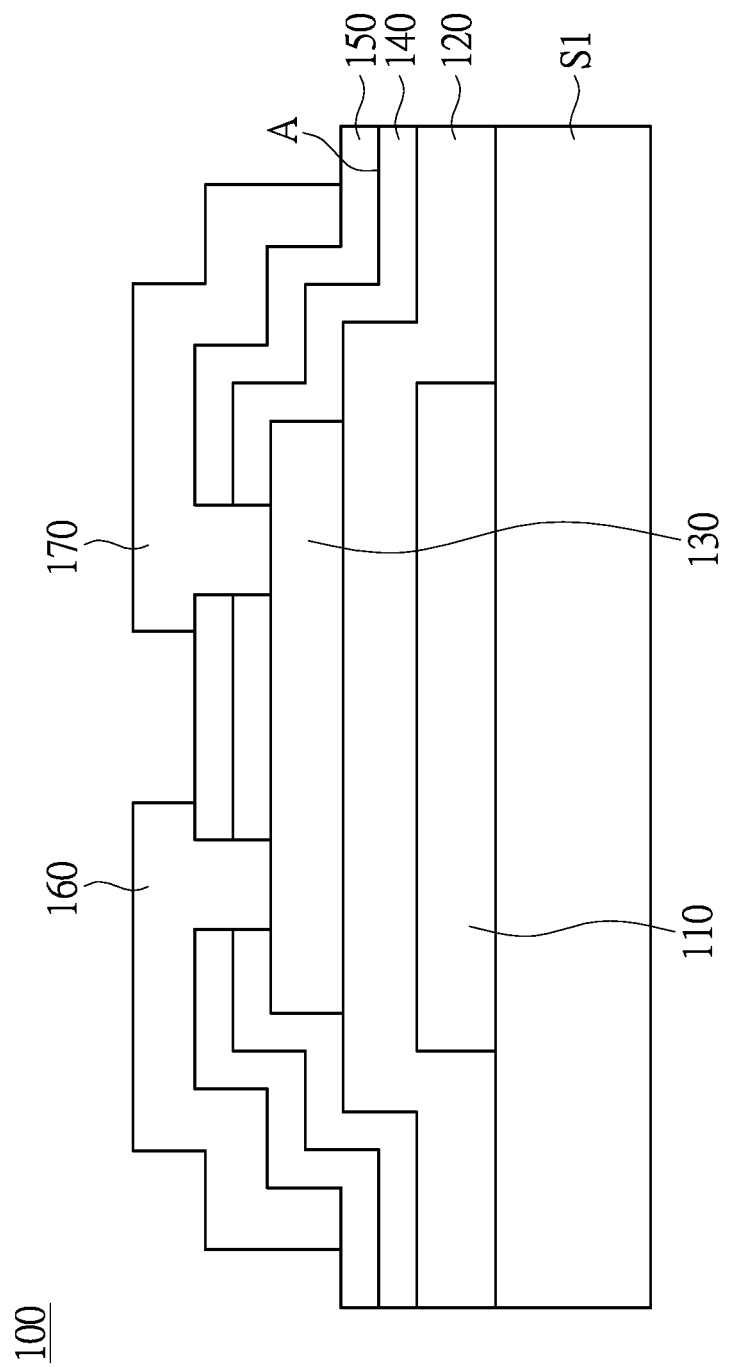
FIG. 1 illustrates a cross-sectional view of a thin film transistor in accordance with a first embodiment of the instant disclosure.

FIG. 1 illustrates a cross-sectional view of a thin film transistor in accordance with the first embodiment of the present disclosure. Please refer to FIG. 1. In the present embodiment, the thin film transistor 100 is a bottom gate thin film transistor and includes a gate electrode 110, a gate insulating layer 120, a metal oxide semiconductor layer 130, a source electrode 160, a drain electrode 170, a first protective layer 140, and a second protective layer 150 all sequentially formed on a substrate S1. The first protective layer 140 and the second protective layer 150 are located between the metal oxide semiconductor layer 130 and the source/drain electrode 160/170.

In general, the substrate S1 is used as a support member of the thin film transistor 100 and can be a plastic substrate, a silicon substrate, a sapphire substrate, a ceramic substrate or a glass substrate. Therefore, the present disclosure does not limit the type of substrate S1.

The gate electrode 110 is disposed on the substrate S1. In general, when a voltage is applied to the gate electrode 100, the thin film transistor can be turned on or off. The gate electrode 110 may have either a single-layer structure or a stacked-layer structure with more than two layers. In instant embodiment, the gate electrode 110 has a single-layer structure. The gate electrode 100 can be made of metallic material, such as Copper (Cu), Aluminum (Al), Titanium (Ti), Tantalum (Ta), Tungsten (W), Molybdenum (Mo), Chromium (Cr), Niobium (Nb) or/and the like. Alternatively, the gate electrode 100 may be made of alloy, such as aluminum-molybdenum alloy or/and aluminum-niobium alloy. Alternatively, the gate electrode 100 may be made of metal nitride, such as tantalum nitride (TaN), and aluminum nitride (AlN) or/and the like.

The gate insulating layer 120 is disposed on the gate electrode 110 and covers part of the substrate S1. In General, the gate insulating layer 120 is used to insulate the gate electrode 110 from the metal oxide semiconductor 130 in order to prevent the thin film transistor 100 from short circuiting. The gate insulating layer 120 may have either a single-layer or a stacked-layer structure. In this embodiment, the gate insulating layer 120 has a single-layer structure. The material of the gate insulating layer may be silicon oxide ($SiO_x$), silicon nitride ($SiN_x$) and/or silicon oxynitride (SiON).

The metal oxide semiconductor 130 is disposed on the gate insulating layer 120. The metal oxide semiconductor 130 is used as a channel layer of the thin film transistor 100. When the thin film transistor 100 is turned on, electrons flow in the metal oxide semiconductor 130. Specifically, a metal oxide film is formed by sputtering process, and then the island-shaped metal oxide semiconductor 130 is produced by photolithography techniques in the subsequent process. It is worth mentioning that the metal oxide semiconductor 130 is made of metallic oxide, and the metal oxide semiconductor layer 130 is made of a material selected from the following: indium-gallium-zinc oxide, zinc oxide, stannous oxide, indium-zinc oxide, gallium-zinc oxide, zinc-tin oxide, indium-tin oxide, or mixtures thereof.

The first protective layer 140 is disposed on the metal oxide semiconductor layer 130, and the second protective layer 150 is disposed on the first protective layer 140. The first and second protective layers 140, 150 are used as an etch stop layer for the metal oxide semiconductor 130. The thickness of the first protective layer 140 is between 20 nanometers and 40 nanometers, and the thickness of the second protective layer 150 is between 40 nanometers and 100 nanometers and more preferably 80 nanometers and 100 nanometers. The materials of both the first protective layer 140 and the second protective layer 150 are silicon oxide ($SiO_x$). In this embodiment, the etch stop layer has a stacked-layer structure with two layers consisting of the first and second protective layers 140, 150. However, in other embodiment, the number of the etch stop layer can be more than two.

To be specific, the first and second protective layers 140, 150 are made by the same production procedure as previously mentioned, such as vacuum evaporation deposition, vacuum sputtering, chemical vapor deposition or the like. During the process of deposition, the first and second protective layers 140, 150 are made by changing the deposition rate in the production procedure. The deposition rate of the first protective layer 140 is lower than the deposition rate of the second protective layer 150. In this embodiment, the deposition rates of the first protective layer 140 and the second protective layer 150 respectively range from 1.3 to 3 (Å/s) and from 3.5 to 6 (Å/s).

Since the first and second protective layers 140, 150 are made in the same production procedure by changing the relative deposition rates, there is no clear distinguished layering between the first and second protective layers 140, 150, which means a boundary area A is formed between the first and second protective layers 140, 150. It is worth noting that the composition of the first and second protective layers 140, 150 can be analyzed via x-ray photoelectron spectroscope. In order to articulate the characteristics of the first and second protective layers 140, 150, the boundary area A is defined as the transition zone between the first protective layer 140 and the second protective layer 150. Namely, the boundary area A consists of portions of the first protective layer 140 extremely close to the second protective layer 150 and portions of the second protective layer 150 extremely close to the first protective layer 140.

In addition, in this embodiment, the etch stop layer has a stacked-layer structure with two layers consisting of the first and second protective layers 140, 150, and a transition zone between the first protective layer 140 and the second protective layer 150. That is, the transitional zone between the first protective layer 140 and the second protective layer 150 is called the boundary area A. However, since the number of layer in etch stop layer can exceed two in other feasible embodiment, the number of transitional zone exists between any two adjacent protective layers can be more than one.

Figure 2:
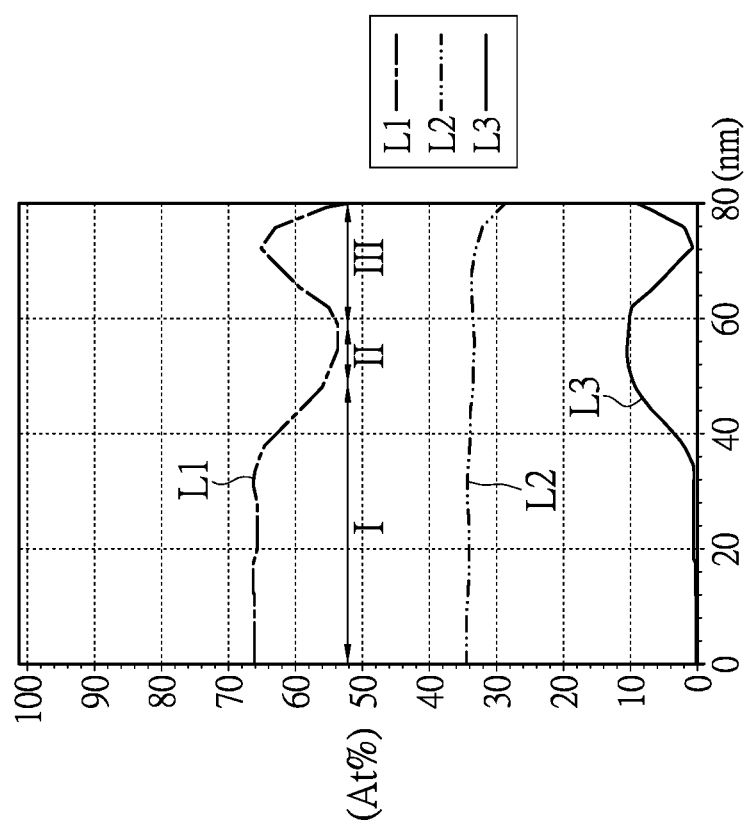
FIG. 2 is a schematic diagram illustrating atomic percentages in a first protective layer, a second protective layer, and a boundary area with respect to the change in depth.

FIG. 2 is a schematic diagram illustrating atomic percentages in the first protective layer, the second protective layer and a boundary area with respect to the change in depth. The Table 1 below shows the ranges of atomic percentages for different atoms and the ranges of atomic ratio of silicon and oxygen in the first protective layer 140, the second protective layer 150 and the boundary area A.

TABLE 1

| At % | Si2p (Si—O) | O1s (OH—) | O1s (oxygen vacancies) | atomic ratio |
|---|---|---|---|---|
| first protective layer (III) and second protective layer (I) | 31~33% | 61~65% | 0~5% | $SiO_{1.8-2.2}$ |
| boundary area (II) | 31~35% | 51~59% | 7~13% | $SiO_{1.5-2.0}$ |

Please refer to FIG. 2 and Table 1. The first protective layer 140 and the second protective layer 150 are to be analyzed through x-ray photoelectron spectroscope, and the materials of the first protective layer 140 and the second protective layer 150 are silicon oxide ($SiO_x$). In FIG. 2, x-axis represents the depth, which extends from the surface of the second protective layer 150 to the first protective layer 140, and Y-axis represents the atomic percentage that are analyzed by x-ray photoelectron spectroscope. The Curve L1 represents a variation curve of atomic percentage of oxygen atoms with a "−2" charge (i.e., oxygen atoms at 1s orbital (OH—) in Table 1) with respect to the change in depth. The Curve L2 represents a variation curve of atomic percentage of silicon atoms at 2p orbital that bond with oxygen atoms (i.e., Si2p (Si—O) in Table 1) with respect to the change in depth. The Curve L3 represents a variation curve of atomic percentage of oxygen atoms with a charge higher than "−2" (i.e., O1s (oxygen vacancies) in Table 1) with respect to the change in depth. In the present embodiment, the atomic percentage of oxygen atoms with a charge higher than "−2" (i.e., between "−2" and "0"), is regarded as oxygen vacancy concentration.

According to the change of each of the curves L1-L3, the first protective layer 140 and the second protective layer 150 can be separated into three sections approximately: the first zone I, the second zone II and the third zone III. The first zone I represents the second protective layer 150, and the second zone II represents the boundary area A, the third zone III represents the first protective layer 140. The first protective layer 140 has a first oxygen vacancy concentration, the second layer 150 has a second oxygen vacancy concentration, and the boundary area A has a third oxygen vacancy concentration. According to the change of Curve L3 in the first zone I, the second zone II and the third zone III, the third oxygen vacancy concentration is greater than the first oxygen vacancy concentration as well as the second oxygen vacancy concentration, and the first oxygen vacancy concentration is greater than the second oxygen vacancy concentration. That is, most oxygen vacancies exist in the boundary area A, which is located between the first protective layer 140 and the second protective layer 150. In Table 1, the materials of the first protective layer 140 and the second protective layer 150 are silicon oxide ($SiO_x$), in which a ratio of silicon to oxygen is between 1:1.8 and 1:2.2. The material of the boundary area A is silicon oxide ($SiO_x$), in which a ratio of silicon to oxygen is between 1:1.5 and 1:2.0.

To be specific, the deposition rate of the first protective layer 140 is lower than the second protective layer 150. Since initially the deposition rate is relatively low, atoms bombarding with the surface of metal oxide semiconductor layer 130 may be relative low so that current leakage is minimized when the first protective layer 140 is being deposited. Then, as the deposition rate increases, so do the oxygen vacancies formed in the boundary area A. As the deposition rate increases, the oxygen vacancy concentration of the boundary area A is larger than the oxygen vacancy concentration of the second protective layer 150.

In addition, in other embodiment, if the number of the etch stop layers is more than two and the boundary areas of thin film transistor correspondingly increase, the oxygen vacancy concentration of each boundary area will be larger than that of each protective layer.

Figure 3A:
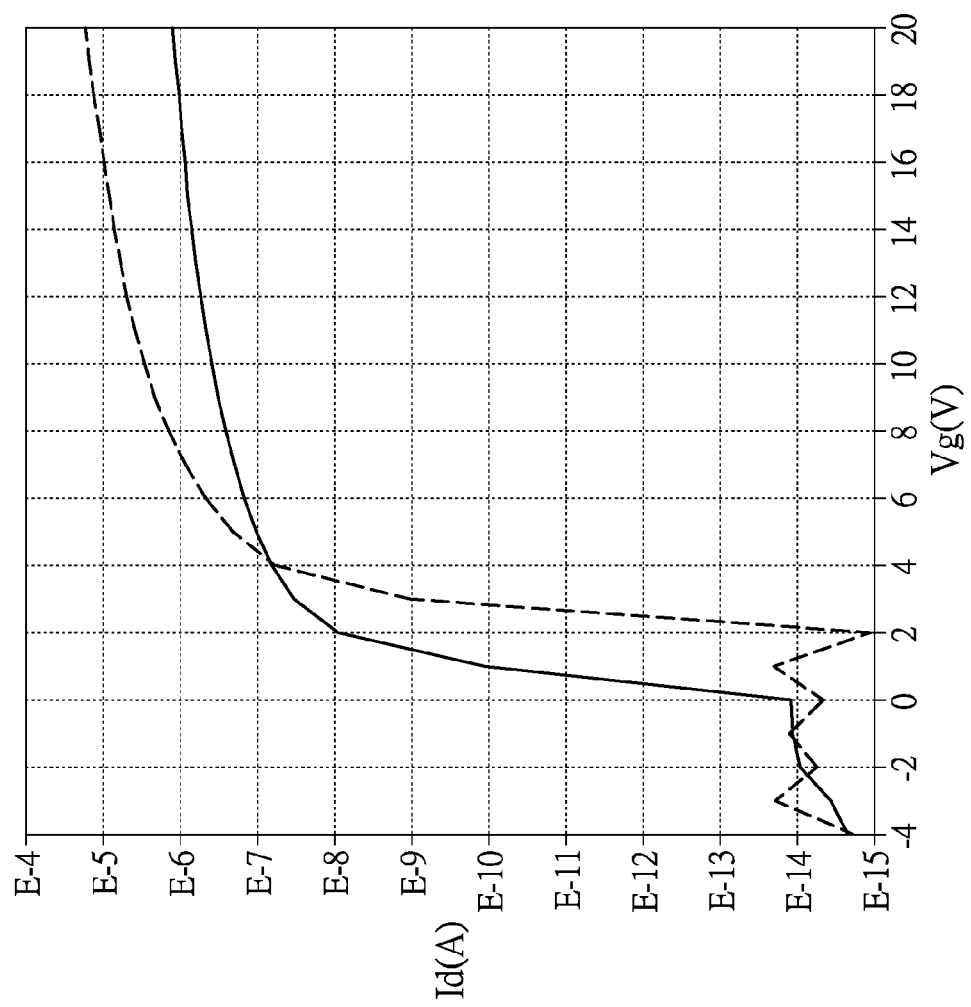
FIG. 3A is a schematic diagram illustrating hysteresis in the current-voltage curve for a thin film transistor having a first protective layer.

FIG. 3A is a schematic diagram illustrating hysteresis in the current-voltage curve for a thin film transistor that has a first protective layer. In FIG. 3A, solid line represents a variation curve of drain current (Id) under the condition that a drain voltage of 0.5 V of is applied and the gate voltage (Vg) rises from −4 V up to 20 V. The dotted line represents a variation curve of drain current (Id) under the condition that the drain electrode applies 10 V of voltage and the gate voltage (Vg) of the gate electrode rises from −4 V up to 20 V.

Figure 3B:
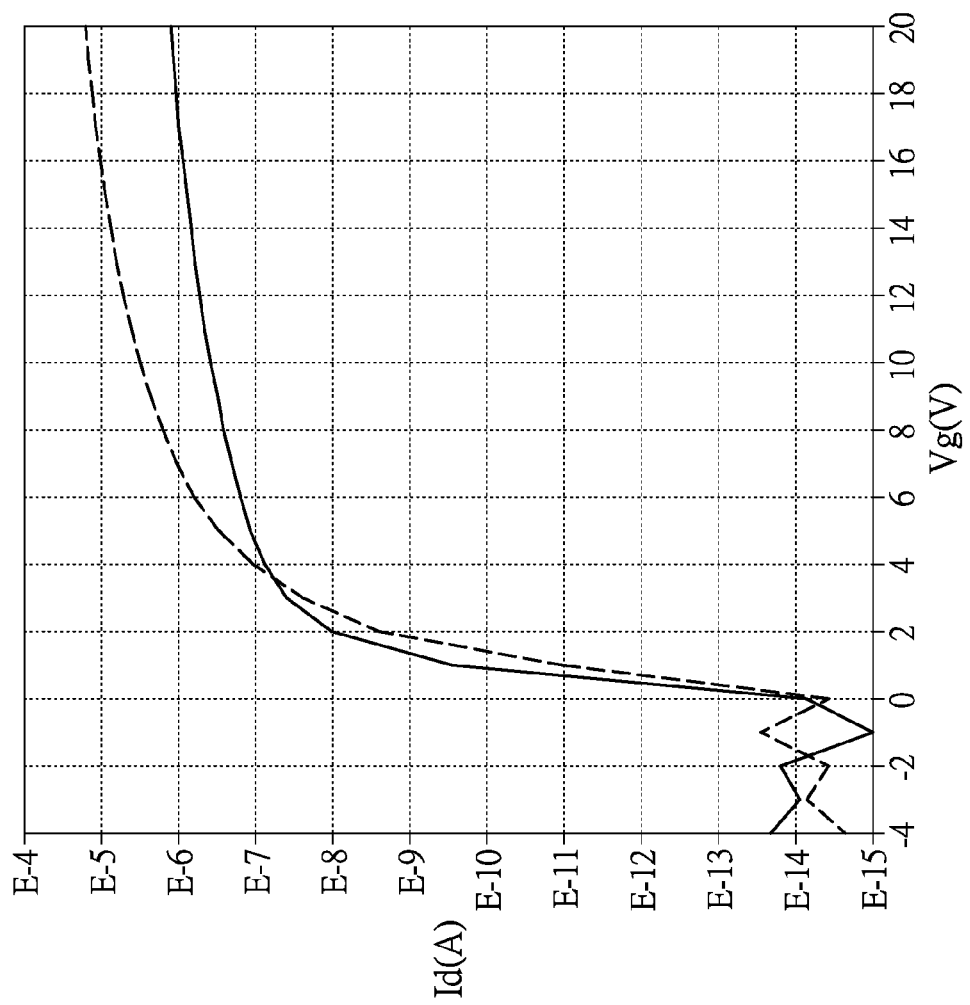
FIG. 3B is a schematic diagram illustrating hysteresis in the current-voltage curve for a thin film transistor having a first protective layer and a second protective layer.

FIG. 3B is a schematic diagram illustrating hysteresis in the current-voltage curve for a thin film transistor that has a first protective layer and a second protective layer. In FIG. 3B, the definitions of the solid line and the dotted line are identical to the definitions in FIG. 3A. In FIG. 3A, a thin film transistor having the first protective layer as etch stop layer is measured. Under the condition that a drain voltage of 0.5 V is applied and the drain current is 10-9 A, the gate voltage is defined as a first threshold voltage. Under the condition that a drain voltage of 10 V is applied and the drain current is 10-9 A, the gate voltage is defined as a second threshold voltage. The absolute value of the difference between the first and second threshold voltages can be used to define the magnitude of the hysteresis value. As the absolute value of the difference between the first and second threshold voltage increases, the magnitude of hysteresis value intensifies. In FIG. 3B, the thin film transistor 100 having the first protective layer 140 and the second protective layer 150 as the etch stop layer is measured, and the magnitude of hysteresis value is relatively small. Therefore, the magnitude of hysteresis in the thin film transistor 100 having the first protective layer 140 and the second protective layer as the etch stop layer is smaller than the magnitude of hysteresis in the thin film transistor having only the first protective layer as the etch stop layer.

Figure 4:
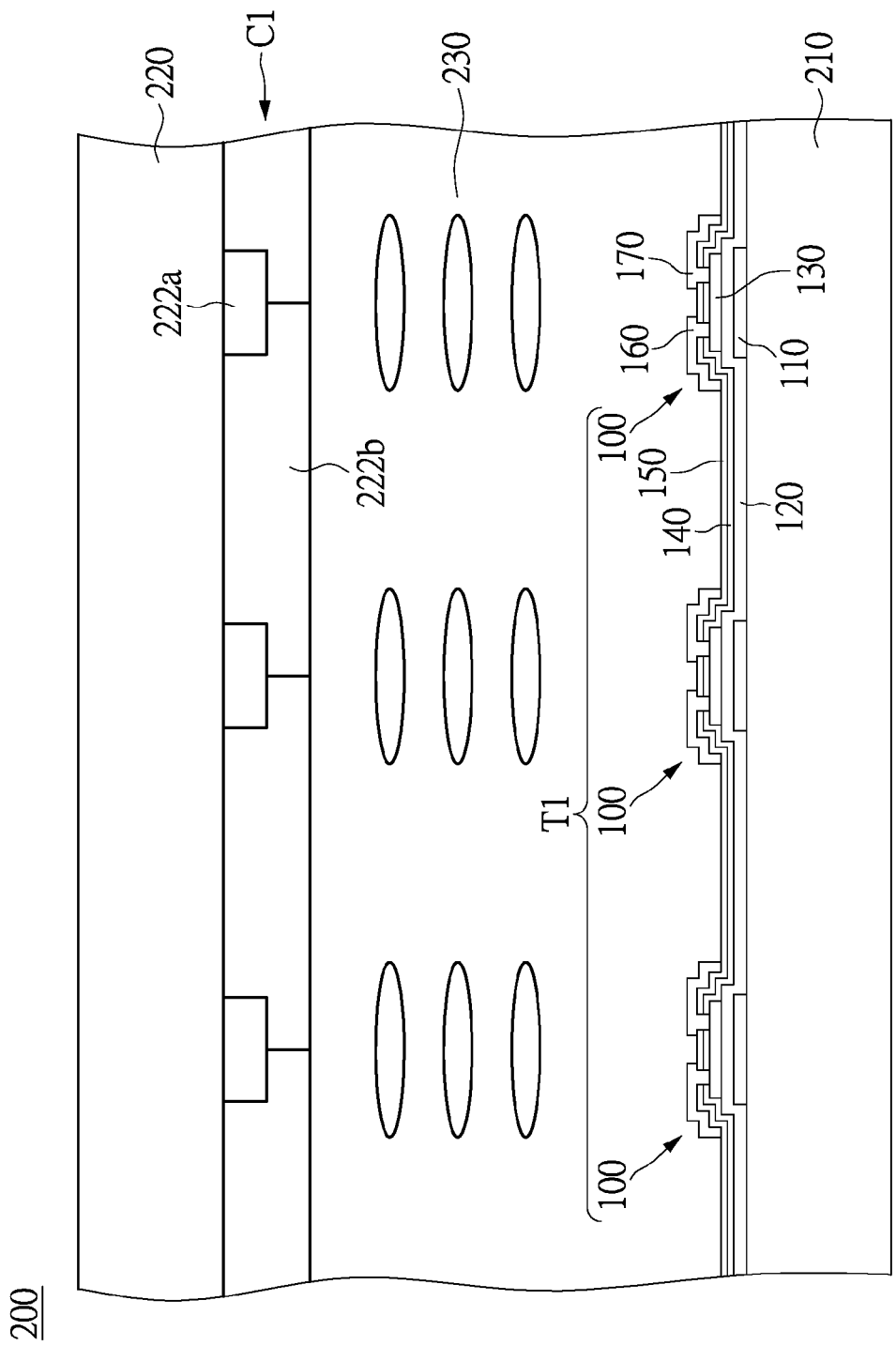
FIG. 4 illustrates a cross-sectional view of a display panel in accordance with the first embodiment of the instant disclosure.

FIG. 4 illustrates a structural prospective view of a display panel in accordance with the first embodiment of the instant disclosure. In this embodiment, the display panel 200 is a liquid crystal panel. Please refer to FIG. 4. The display panel 200 includes a first substrate 210, a second substrate 220, a display medium 230 such as a liquid crystal layer and an active element array layer T1. The first substrate 210 is combined with the second substrate 220, and the display medium 230 and the active element array layer T1 are disposed between the first substrate 210 and the second substrate 220. The active element array layer T1 includes at least one thin film transistors.

The first substrate 210 and the second substrate 220 are made of glass, plastic or quartz. The instant disclosure does not limit the materials of these substrates 210 and 220.

The display panel 200 can include the color filter layer C1 that is located on the second substrate 220. The color filter layer C1 includes a light-shielding layer 222a and a plurality of color filters 220b with various colors. The light-shielding film 222a is used to shield the light from backlight module in order to avoid the effect in imagery performance caused by the leaking of light. Partial surface of the second substrate 220 is exposed from the light-shielding film 222a to be partitioned into a plurality of monochromatic pixel regions (not shown). The color filters 222b with various colors are disposed in these mono-chromatic pixel regions. The materials of the light-shielding layer 222a may be black resin and black photoresist material, and so on. The color filters 222b are photoresists of various colors, and the material of the color filters 222b may be photoresist material. The color of the color filters 222b may be red, green, blue, and so on. For different product designs in the display panel, the configuration of the color filters 222b may be a combination of the following types: mosaic type, delta type, and stripe type. The instant disclosure does not limit the color, materials, and configuration of color filters 222b.

The display medium 230 is disposed between the first substrate 210 and the second substrate 220. The display medium 230 can be a liquid crystal layer made of various types of materials, such as, nematic liquid crystals, smectic liquid crystals, cholesteric liquid crystals, and so on to change the direction of the polarization of incident light. However, the instant disclosure does not limit the types of materials of the display medium 230. Moreover, the display medium 230 can also be an electroluminescent element, such as, organic light emitting diode, inorganic light emitting diode, and so on to generate light by consuming electricity.

The active element array layer T1, which is disposed on the first substrate 201, consists of a plurality of thin film transistors 100, a plurality of data lines (not shown) and a plurality of scan lines (not shown). The active element array layer T1 consists of thin film transistors 100 that correspond to the arrangement of the color filters 222b. The thin film transistor 100 includes the gate electrode 110, the gate insulating layer 120, the metal oxide semiconductor layer 130, the source electrode 160, the drain electrode 170, the first protective layer 140, and the second protective layer 150, all of which are sequentially formed on the substrate S1. The first protective layer 140 and the second protective layer 150 are located between the metal oxide semiconductor layer 130 and the source/drain electrodes 160/170. The drain electrode 160 is connected to the date lines (not shown), and the gate electrode 110 is connected to the scan lines (not shown).

The first protective layer 140 is disposed on the metal oxide semiconductor layer 130, and the second protective layer 150 is disposed on the first protective layer 140. The thickness of the first protective layer 140 is between 20 nanometers and 40 nanometers, and the thickness of the second protective layer 150 is between 40 nanometers and 100 nanometers and more preferably 80 nanometers and 100 nanometers. The materials of both the first protective layer 140 and the second protective layer 150 are silicon oxide ($SiO_x$).

To be specific, the first protective layer 140 and the second protective layer 150 are produced through the same deposition procedure. During the process of deposition, the deposition rate of the first protective layer 140 is lower than the deposition rate of the second protective layer 150. Since initially the deposition rate is relatively low, atoms bombarding with the surface of metal oxide semiconductor layer 130 may be relative low so that current leakage is minimized when the first protective layer 140 is being deposited. Then, as the deposition rate increases, so do the oxygen vacancies formed in the boundary area A. As the deposition rate increases, the oxygen vacancy concentration of the boundary area A is larger than the oxygen vacancy concentration of the second protective layer 150. Namely, most of oxygen vacancy concentrations exist in the boundary area A located between the first protective layer 140 and the second protective layer 150. The hysteresis observed in the thin film transistor 100 will be improved by forming the first protective layer 140 and the second protective layer 150 on the metal oxide semiconductor layer 130, and when the deposition rate of the first protective layer 140 is lower than the deposition rate of the second protective layer 150. Therefore, the response speed of a display panel and the flash phenomenon, or ghost image, is improved.

In summary, the instant disclosure provides at least two etch stop layers, which are the first and second protective layers. The first and second protective layers are produced through the same production procedure, in which the deposition rate of the first protective layer is lower than the second protective layer. Since initially the deposition rate is relatively low, atoms bombarding with the surface of metal oxide semiconductor layer may be relative low so that current leakage is minimized when the first protective layer is being deposited. Then, as the deposition rate increases, so do the oxygen vacancies formed in the boundary area A. As the deposition rate increases, the oxygen vacancy concentration of the boundary area is larger than the oxygen vacancy concentration of the second protective layer. The hysteresis observed in the thin film transistor is improved by forming the first protective layer and the second protective layer on the metal oxide semiconductor layer, and when the deposition rate of the first protective layer is lower than the deposition rate of the second protective layer.

An embodiment of the instant disclosure provides a thin film transistor that is available to various display panels, such as LCD displays, OLED displays, or LED displays while the response speed of a display panel, the effect of hysteresis, and the flash phenomenon, or ghost image, of the display panel are improved.

The above-mentioned descriptions represent merely the exemplary embodiment of the instant disclosure, without any intention to limit the scope of the instant disclosure thereto. Various equivalent changes, alternations or modifications based on the claims of instant disclosure are all consequently viewed as being embraced by the scope of the present disclosure.

What is claimed is:

1. A thin film transistor substrate, comprising:
a substrate;
a gate electrode disposed on the substrate;
a semiconductor layer insulated from the gate electrode;
a source electrode and a drain electrode electrically connecting to the semiconductor layer; and
a protective layer disposed on the semiconductor layer, wherein the protective layer comprises a first part disposed on a surface of the semiconductor layer, and wherein atomic percentage of oxygen atoms at 1s orbital (OH—) of the first part of the protective layer is measured to obtain a curve with respect to a depth of the protective layer,
wherein the curve comprises a first portion and a second portion, wherein the first portion is corresponding to a top half of the depth of the first part of the protective layer and the second portion is corresponding to a bottom half of the depth of the first part of the protective layer,
wherein a smallest value of the first portion is greater than a smallest value of the second portion, and
wherein the top half of the depth of the first part of the protective layer and the bottom half of the depth of the first part of the protective layer are made by a same production procedure.

2. The thin film transistor substrate as claimed in claim 1, wherein the protective layer is made of silicon oxide and comprises a plurality of layers.

3. The thin film transistor substrate as claimed in claim 1, wherein the protective layer comprises a first layer and a second layer, wherein the first layer is disposed between the semiconductor layer and the second layer, wherein a deposition rate for depositing the second layer is greater than a deposition rate for depositing the first layer.

4. The thin film transistor substrate as claimed in claim 1, wherein the protective layer comprises a first layer and a second layer, wherein the first layer is disposed between the semiconductor layer and the second layer, wherein a thickness of the second layer is greater than a thickness of the first layer.

5. The thin film transistor substrate as claimed in claim 4, wherein the thickness of the first layer is between 20 nanometers and 40 nanometers.

6. The thin film transistor substrate as claimed in claim 4, wherein the thickness of the second layer is between 40 nanometers and 100 nanometers.

7. The thin film transistor substrate as claimed in claim 1, wherein the curve is obtained by measuring the atomic percentage of oxygen atoms at 1s orbital (OH—) of the protective layer through x-ray photoelectron spectroscope.

8. The thin film transistor substrate as claimed in claim 1, wherein the protective layer is formed by a deposition procedure, wherein the deposition procedure comprises two deposition rates.

9. The thin film transistor substrate as claimed in claim 1, wherein the semiconductor layer is a metal oxide semiconductor layer.

10. The thin film transistor substrate as claimed in claim 9, wherein a material of the metal oxide semiconductor layer is selected from the group consisting of indium-gallium-zinc oxide, zinc oxide, stannous oxide, indium-zinc oxide, gallium-zinc oxide, zinc-tin oxide, indium-tin oxide, and the mixtures thereof.

11. A display panel, comprising:
a first substrate;
a second substrate oppositely arranged with respect to the first substrate; and
a display medium disposed between the first substrate and the second substrate;
wherein the first substrate comprises:
a substrate;
a gate electrode disposed on the substrate;
a semiconductor layer insulated from the gate electrode;
a source electrode and a drain electrode electrically connecting to the semiconductor layer, and
a protective layer disposed on the semiconductor layer, wherein the protective layer comprises a first part disposed on a surface of the semiconductor layer, and wherein atomic percentage of oxygen atoms at 1s orbital (OH—) of the first part of the protective layer is measured to obtain a curve with respect to a depth of the protective layer,
wherein the curve comprises a first portion and a second portion, wherein the first portion is corresponding to a top half of the depth of the first part of the protective layer and the second portion is corresponding to a bottom half of the depth of the first part of the protective layer,
wherein a smallest value of the first portion is greater than a smallest value of the second portion, and
wherein the top half of the depth of the first part of the protective layer and the bottom half of the depth of the first part of the protective layer are made by a same production procedure.

12. The display panel as claimed in claim 11, wherein the protective layer is made of silicon oxide and comprises a plurality of layers.

13. The display panel as claimed in claim 11, wherein the protective layer comprises a first layer and a second layer, wherein the first layer is disposed between the semiconductor layer and the second layer, wherein a deposition rate for depositing the second layer is greater than a deposition rate for depositing the first layer.

14. The display panel display panel as claimed in claim 11, wherein the protective layer comprises a first layer and a second layer, wherein the first layer is disposed between the semiconductor layer and the second layer, wherein a thickness of the second layer is greater than a thickness of the first layer.

15. The display panel as claimed in claim 14, wherein the thickness of the first layer is between 20 nanometers and 40 nanometers.

16. The display panel as claimed in claim 14, wherein the thickness of the second layer is between 40 nanometers and 100 nanometers.

17. The display panel as claimed in claim 11, wherein the curve is obtained by measuring the atomic percentage of oxygen atoms at 1s orbital (OH—) of the protective layer through x-ray photoelectron spectroscope.

18. The display panel as claimed in claim 11, wherein the protective layer is formed by a deposition procedure, wherein the deposition procedure comprises two deposition rates.

19. The display panel as claimed in claim 11, wherein the semiconductor layer is a metal oxide semiconductor layer.

20. The display panel as claimed in claim 11, wherein a material of the metal oxide semiconductor layer is selected from the group consisting of indium-gallium-zinc oxide, zinc oxide, stannous oxide, indium-zinc oxide, gallium-zinc oxide, zinc-tin oxide, indium-tin oxide, and the mixtures thereof.

* * * * *